United States Patent
Lo et al.

(10) Patent No.: US 8,629,066 B2
(45) Date of Patent: Jan. 14, 2014

(54) LINER FORMATION IN 3DIC STRUCTURES

(75) Inventors: Ching-Yu Lo, Hsin-Chu (TW);
Hung-Jung Tu, Hualien (TW);
Hai-Ching Chen, Hsin-Chu (TW);
Tien-I Bao, Dayuan Township (TW);
Wen-Chih Chiou, Miaoli (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/562,101

(22) Filed: Jul. 30, 2012

(65) Prior Publication Data

US 2012/0289062 A1 Nov. 15, 2012

Related U.S. Application Data

(63) Continuation of application No. 12/617,900, filed on Nov. 13, 2009, now Pat. No. 8,264,066.

(60) Provisional application No. 61/223,977, filed on Jul. 8, 2009.

(51) Int. Cl.
*H01L 21/336* (2006.01)

(52) U.S. Cl.
USPC ........... 438/782; 438/598; 438/197; 438/289; 438/270

(58) Field of Classification Search
USPC .................... 438/598, 782, 270, 289, 197
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,919,255 B2 | 7/2005 | Birner et al. |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |

(Continued)

*Primary Examiner* — S. V. Clark
*Assistant Examiner* — Krista Soderholm
(74) *Attorney, Agent, or Firm* — Slater & Matsil, L.L.P.

(57) ABSTRACT

An integrated circuit structure includes a semiconductor substrate; a through-semiconductor via (TSV) opening extending into the semiconductor substrate; and a TSV liner in the TSV opening. The TSV liner includes a sidewall portion on a sidewall of the TSV opening and a bottom portion at a bottom of the TSV opening. The bottom portion of the TSV liner has a bottom height greater than a middle thickness of the sidewall portion of the TSV liner.

18 Claims, 10 Drawing Sheets

(56) References Cited

U.S. PATENT DOCUMENTS

| | | |
|---|---|---|
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,833,895 B2 * | 11/2010 | Bonifield et al. .............. 438/598 |
| 2005/0215012 A1 * | 9/2005 | Williams et al. .............. 438/270 |
| 2007/0196997 A1 * | 8/2007 | Kim et al. ..................... 438/424 |
| 2010/0171223 A1 * | 7/2010 | Kuo et al. ..................... 257/773 |

\* cited by examiner

100 # LINER FORMATION IN 3DIC STRUCTURES

This application is a continuation of U.S. patent Ser. No. 12/617,900, filed Nov. 13, 2009, entitled "Liner Formation in 3DIC Structures," which application further claims priority to and claims the benefit of U.S. Provisional Application No. 61/223,977 filed on Jul. 8, 2009, entitled "Liner Formation in 3DIC Structures," which application are hereby incorporated herein by reference.

TECHNICAL FIELD

This invention relates generally to integrated circuit structures, and more particularly to through-silicon vias, and even more particularly to the formation of liners for the through-silicon vias.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area.

These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

An additional limitation comes from the significant increase in the number and length of interconnections between devices as the number of devices increases. When the number and length of interconnections increase, both circuit RC delay and power consumption increase.

Efforts for resolving the above-discussed limitations commonly include the use of three-dimensional integrated circuits (3DICs) and stacked dies. Through-silicon vias (TSVs) are often used in 3DICs and stacked dies for connecting dies. In this case, TSVs are used to connect the integrated circuits on a die to the backside of the die. In addition, TSVs are also used to provide a short grounding path to connect the ground in the integrated circuits to the backside of the die, which is typically covered by a grounded aluminum film.

Typically, the formation of TSVs includes forming TSV openings, forming TSV liners in the TSV openings, and filling metallic materials into the remaining portion of the TSV openings. TSV openings often have high aspect ratios, for example, greater than about 7. It is thus difficult to form conformal TSV liners. FIGS. 1A through 1G illustrate a conventional process for forming TSV liners, which process comprises multiple etch and re-deposition cycles. Referring to FIG. 1A, TSV opening 102 is formed in substrate 100. In FIG. 1B, TSV liner 104 is deposited on sidewalls of TSV opening 102 using chemical vapor deposition (CVD). It is noted that portions of TSV liner 104 close to the top portion of TSV opening 102 are very thick, while portions of TSV liner 104 close to the bottom portion of TSV opening 102 are very thin, or do not exist at all. With such a profile of TSV liner 104, it is difficult to fill a metallic material into TSV opening 102. Therefore, as shown in FIG. 1C, an etch-back is performed to reduce the thickness of TSV liner 104, particularly the top portion of TSV liner 104. A second deposition is then performed, as shown in FIG. 1D. FIGS. 1E, 1F and 1G illustrate the repeated etch-back and deposition of TSV liner 104. The above-discussed process has the effect of increasing the conformity of TSV liner 104. However, even with the repeated etch-back and re-deposition cycles, the sidewall coverage of TSV liner 104 is still unsatisfactory. Particularly, the bottom portions of TSV liner 104 are often much thinner than the top portions, especially in TSV openings having very high aspect ratios.

In the above-discussed cycles, sub-atmospheric chemical vapor deposition (SACVD) may also be used to deposit TSV liner 104. The profile of the resulting liner is better than when it is formed using CVD. However, the cost of SACVD is high. In addition, the SACVD can only be used to deposit $SiO_2$, which has a k value of 3.9. It cannot be used to form low-k dielectric layers.

Accordingly, new TSV formation processes are needed to form TSV liners having better coverage without incurring additional manufacturing cost.

SUMMARY OF THE INVENTION

In accordance with one aspect of the present invention, an integrated circuit structure includes a semiconductor substrate; a through-semiconductor via (TSV) opening extending into the semiconductor substrate; and a TSV liner in the TSV opening. The TSV liner includes a sidewall portion on a sidewall of the TSV opening and a bottom portion at a bottom of the TSV opening. The bottom portion of the TSV liner has a bottom height greater than a middle thickness of the sidewall portion of the TSV liner.

Other embodiments are also disclosed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel process for forming through-substrate vias (TSVs, also known as through-silicon vias or through-semiconductor vias) is provided. The intermediate stages in the manufacturing of an embodiment are illustrated. The variations of the embodiments are discussed. Throughout the various views and illustrative embodiments of the present invention, like reference numbers are used to designate like elements.

Figure 1A:
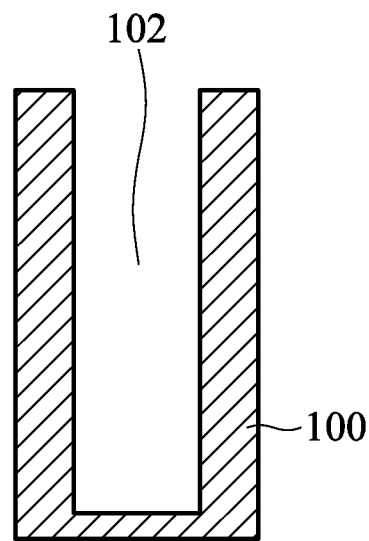
FIGS. 1A through 1G illustrate cross-sectional views of intermediate stages in the manufacturing of a conventional liner in a through-silicon via (TSV) opening, wherein etch-back and re-deposition cycles are performed to improve the profile of the liner.
Figure 1B:
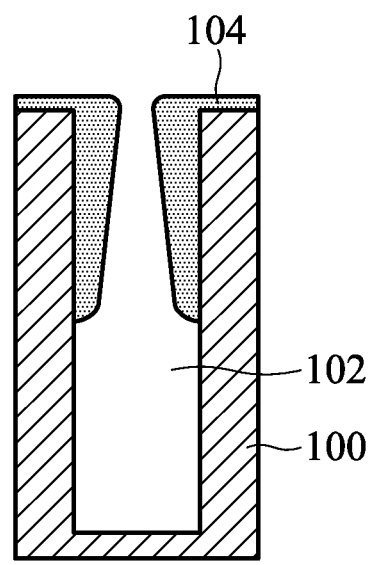
Figure 1C:
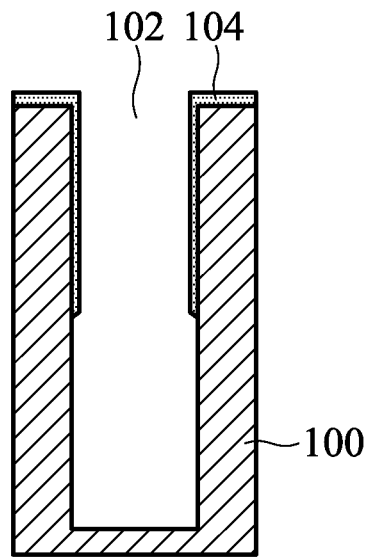
Figure 1D:
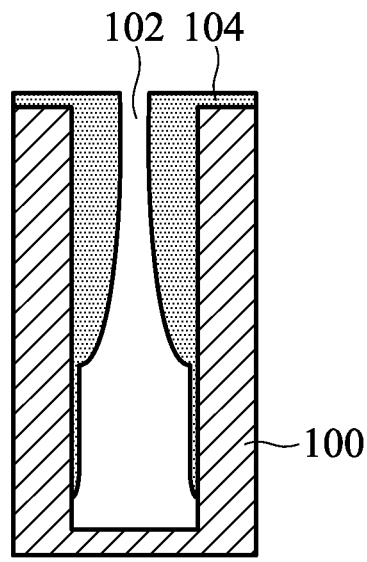
Figure 1E:
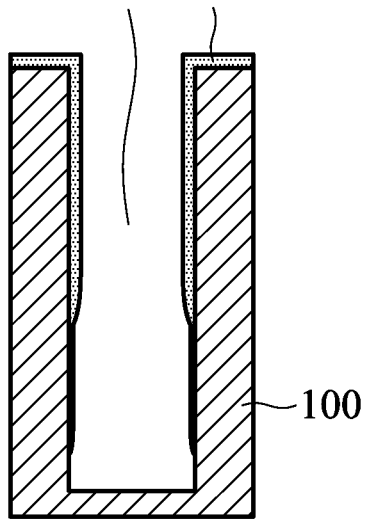
Figure 1F:
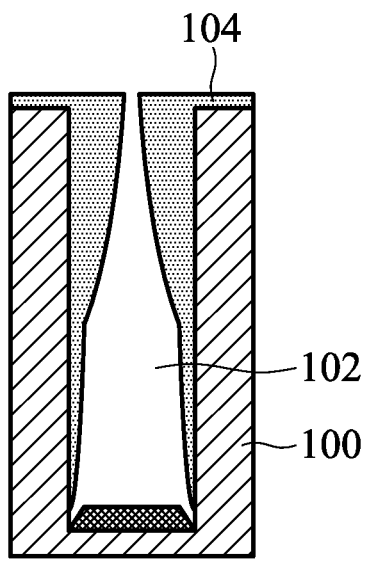
Figure 1G:
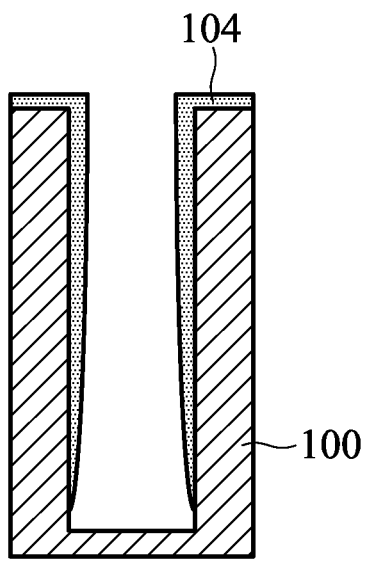
Figure 2:
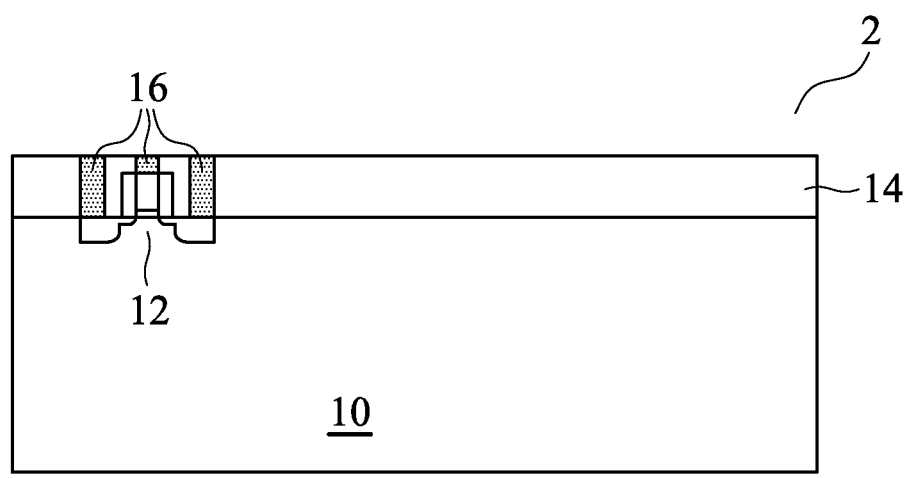
FIGS. 2-4 and 7-10 illustrate a process for forming a TSV in accordance with an embodiment.

Referring to FIG. 2, wafer 2, which includes substrate 10, is provided. Substrate 10 may be a semiconductor substrate, such as a bulk silicon substrate, although it may include other semiconductor materials such as group III, group IV, and/or group V elements. Integrated circuit device 12 (symbolized by transistor 12), which may include devices such as transistors, resistors, capacitors, and the like, may be formed at the top surface (the surface facing up in FIG. 2) of substrate 10. Inter-layer dielectric (ILD) 14 is formed over integrated circuit device 12 and substrate 10. Contact plugs 16 are formed in ILD 14 and connected to integrated circuit device 12.

Figure 3:
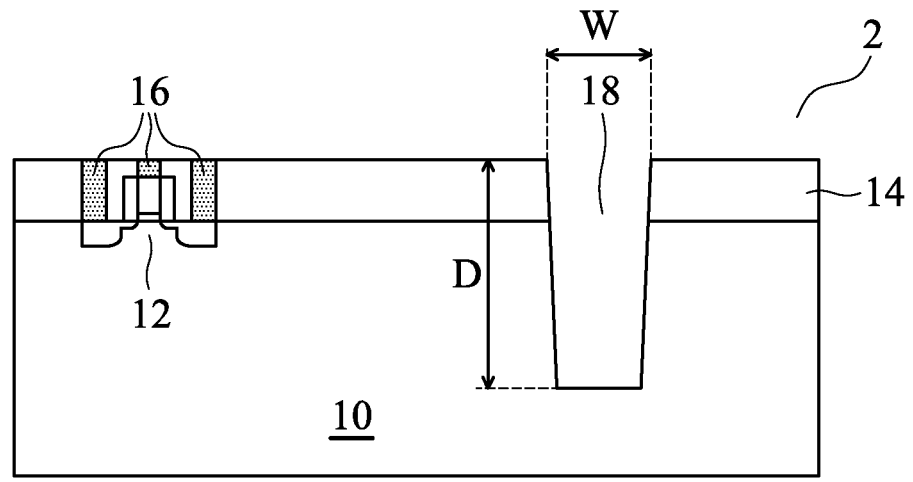

A photo resist (not shown) is then applied on ILD 14 and patterned. Referring to FIG. 3, a first etch is performed using the photo resist to form TSV opening 18, which extends from the top surface of ILD 14 into substrate 10. The bottom of TSV opening 18 should be lower than the bottoms of shallow trench isolation (STI) regions (not shown) in wafer 2. TSV opening 18 may be formed by, for example, dry etch, although other methods such as laser drilling may also be used. After the formation of TSV opening 18, the photo resist is removed. TSV opening 18 may have an aspect ratio (the ratio of depth D to width W) greater than about 7, greater than about 8, or even greater than about 10.

Figure 4:
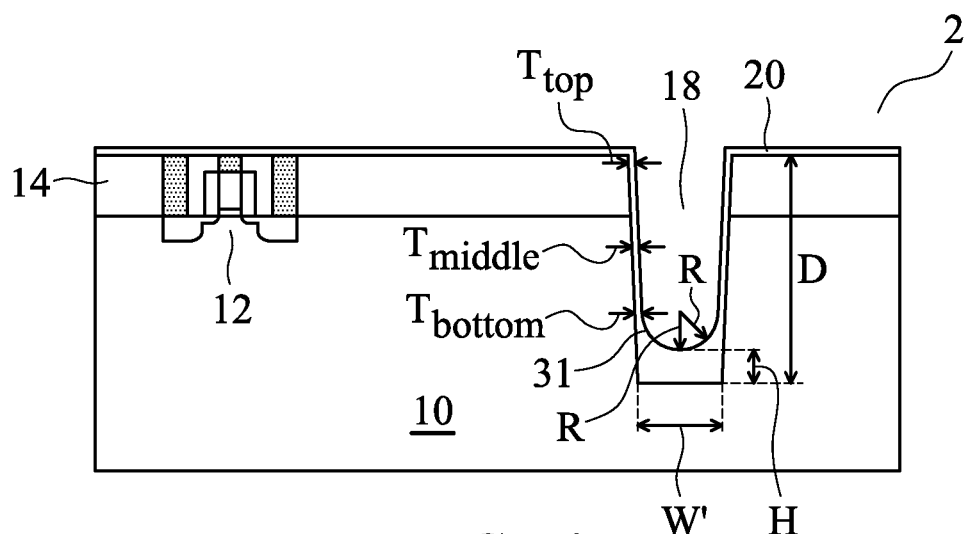

Next, as shown in FIG. 4, TSV liner 20 (also commonly known as an insulation layer) is formed. The formation details of TSV liner 20 are discussed with reference to FIGS. 5 and 6. In an embodiment, the formation of TSV liner 20 is performed using spin-on coating. The spin-on coating process involves spraying a chemical, which is flowable, on wafer 2, and rotating wafer 2. In an exemplary embodiment, the chemical includes tetra-ethyl-ortho-silicate (TEOS), methyl-triethoxysilane (MTES), or combinations thereof. The chemical may go through a SOL-GEL process to form a polymer, which process results in an increase in the cross-links in the chemical. The chemical in the form of a polymer is then dissolved in a solvent. In an exemplary embodiment, the solvent comprises ethanol, isopropyl alcohol, acetone, ether, tetrahydrofuran (THF), and/or the like. The solvent is easy to evaporate. The evaporation of the solvent affects the formation of TSV liner 20, and with the evaporation of the solvent, the viscosity of the chemical increases. The evaporation rate of the chemical, after the solvent is added, may be measured using equilibrium vapor pressure. In an embodiment, at the time the chemical is sprayed on wafer 2 (FIG. 5), the equilibrium vapor pressure is greater than about 3 pound per square inch (psi).

Figure 5:
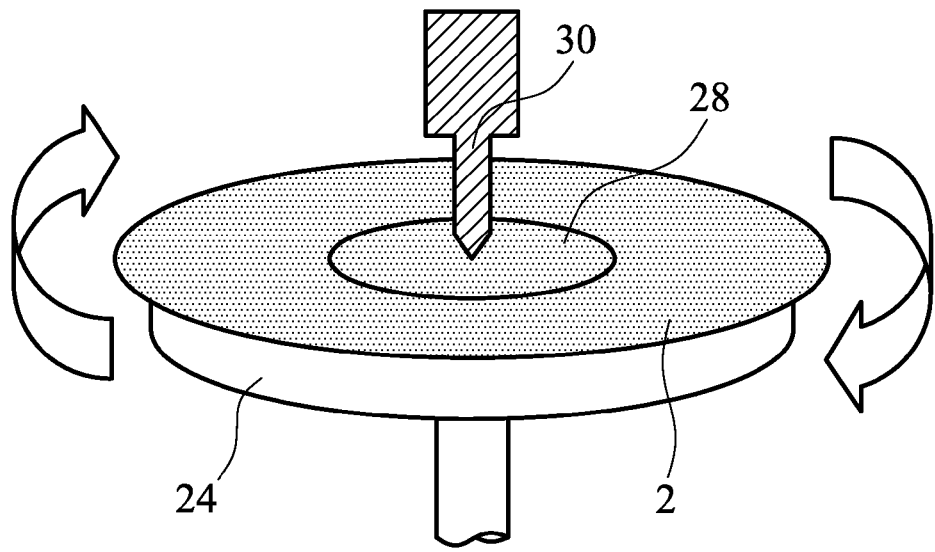
FIGS. 5 and 6 illustrate a spin-on coating process.
Figure 6:
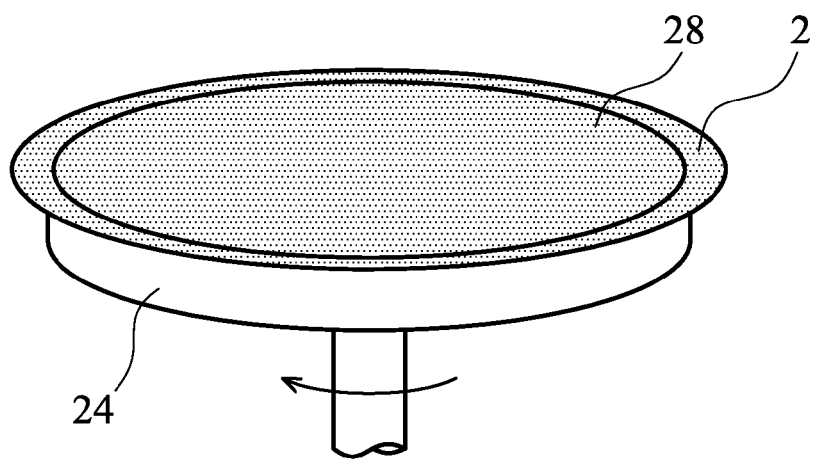

Referring to FIG. 5, wafer 2 is placed on chuck 24. Wafer 2 is then rotated so that chemical 28 is spread, as shown in FIG. 6. In an embodiment, wafer 2 may be rotated at a low speed, for example, between about 200 revolutions per minute (RPM) and about 250 RPM. At the time wafer 2 is rotated, the chemical (denoted as chemical 28 hereinafter) is dispensed onto wafer 2 through nozzle 30. To uniformly dispense chemical 28, nozzle 30 may shift in position during the dispensing.

After the dispensing of chemical 28, wafer 2 may stop rotating, or may rotate at a very low speed, for example, less than about 100 RPM for a period of time. Depending on the composition of chemical 28 and various other conditions, the period of time may last more than about 10 seconds, and may be between about 10 seconds and about one minute, before wafer 2 starts spinning again. It is realized, however, that the above-mentioned data are merely examples, and optimal values may be found through experiments. During the period of time, the chemical flows down to the bottom of TSV opening 18 (refer to FIG. 4). In the meantime, with the evaporation of the solvent, chemical 28 starts to shape on the sidewall of TSV opening 18. Over time, some of chemical 28 flows to the bottom of TSV opening 18, and some stays on the sidewall of TSV opening 18.

After the period of time ends, wafer 2 is rotated again at a high speed, for example, between about 500 RPM and about 3,000 RPM, and excess chemical 28 is spun off wafer 2. Next, a soft bake is performed, for example, at about 140° C., for between about 0.5 minutes and about 15 minutes. A hard bake is also performed, for example, at about 350° C., for between about 0.5 minutes and about 60 minutes. As a result, the dried and baked chemical 28 forms TSV liner 20 (FIG. 4).

It is observed that various factors may affect the conformity and the sidewall coverage of TSV liner 20. For example, if the solvent has a low evaporation rate, then chemical 28 is slow to shape, and more chemical 28 will flow to the bottom of TSV opening 18 (FIG. 4), or may even fully fill TSV opening 18, rather than staying on the sidewall of TSV opening 18. Conversely, if the solvent has a high evaporation rate, then more chemical 28 will stay on the top portion of the sidewall of TSV opening 18 (FIG. 4), rather than flowing to the bottom portion of the sidewall and the bottom of TSV opening 18. This will result in the top portion of TSV liner 20 being thicker than the bottom portion. The period of time during which wafer 2 stops spinning also has an effect on the profile of TSV liner 20, with a longer period of time causing more chemical 28 to flow to the bottom, and a shorter period of time causing inadequate amounts of chemical 28 to flow to the bottom portion of the sidewall of TSV opening 18. Further, there are other relevant factors, such as the flowing rate of nitrogen introduced into the chamber in which wafer 2 is located, and the temperature of wafer 2 when the chemical is dispensed and when wafer 2 spins. A higher flowing rate of hydrogen and a higher temperature of wafer 2 result in less chemical 28 flowing to the bottom of TSV opening 18, while a lower flowing rate of hydrogen and a lower temperature of wafer 2 result in more chemical 28 flowing to the bottom of TSV opening 18, and less remaining on the top portion of the sidewall. In addition to the above-discussed factors, other factors such as the composition of chemical 28, the spin speed, the spin time, the baking temperature, and the like all affect the profile of TSV liner 20, and experiments are needed to obtain optimum results.

Referring back to FIG. 4, with the formation conditions of TSV liner 20 carefully controlled, the conformity of TSV liner 20 is high. Experiment results have revealed that the sidewall portion of TSV liner 20 has a top thickness $T_{top}$, a middle thickness $T_{middle}$, and a bottom thickness $T_{bottom}$, with the differences between any two of thicknesses $T_{top}$, $T_{middle}$, and $T_{bottom}$ being less than about 10 percent of any of thicknesses $T_{top}$, $T_{middle}$, and $T_{bottom}$. Thicknesses $T_{top}$, $T_{middle}$, and $T_{bottom}$ are measured at locations close to the top, the middle, and the bottom of TSV opening 18, respectively. Further, thickness $T_{middle}$ is close to, but may be slightly greater than, thickness $T_{top}$, while thickness $T_{bottom}$ is close to, but may be slightly greater than, thickness $T_{middle}$. The thicknesses of the sidewall portion of TSV liner 20 may increase continuously, but slightly, from top to bottom.

In addition, the bottom of TSV opening 18 is filled with TSV liner 20, wherein the filled portion has height H that is between about 5 percent and about 20 percent of the depth D of TSV opening 18. The ratio H/D may also be close to about 10 percent. In addition, depth D is greater than any of thicknesses $T_{top}$, $T_{middle}$, and $T_{bottom}$, with ratios of $H/T_{middle}$, H/T$_{top}$, or H/T$_{bottom}$ being greater than about 2, or even greater than about 5. The bottom portion of TSV liner 20, which is at the bottom of TSV opening 18, may have a U-shaped top surface 31, with a radius R of any portion of top surface 31 being greater than about 10 percent, 20 percent, or even 30 percent of bottom width W' of TSV opening 18.

The material and k value of TSV liner 20 may be adjusted by adjusting the material of chemical 28 (FIG. 5). With the use of TEOS, the resulting TSV liner 20 comprises silicon dioxide, which has a k value of 3.9. With the use of MTES, the resulting TSV liner 20 has a low k value, which may be lower than about 3.5, or even lower than about 2.5. By adjusting the percentage of TEOS and MTES in the compound chemical 28, the k value may be adjusted to a desirable value. If a lower k value is desirable, then the percentage of MTES may be increased. Otherwise, the percentage of TEOS may be increased.

Figure 7:
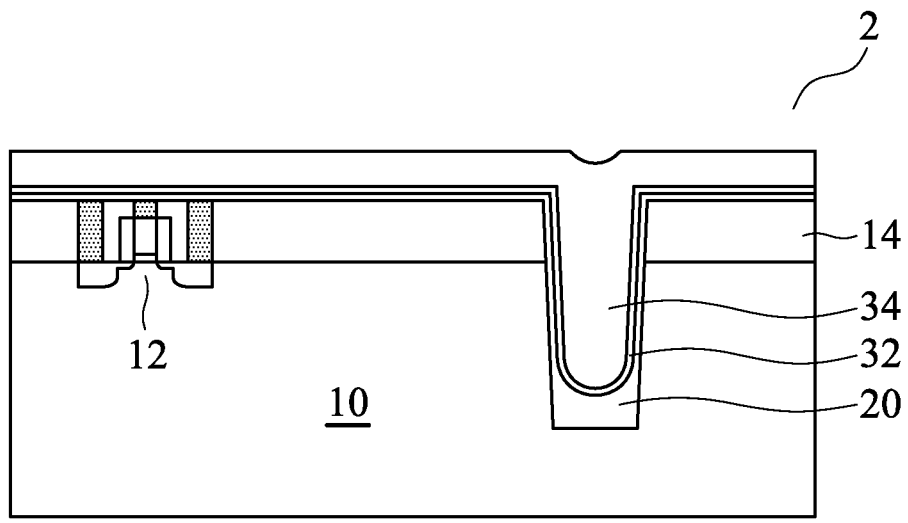

After the formation of TSV liner 20, as shown in FIG. 7, diffusion barrier layer 32, also sometimes referred to as a glue layer, is blanket formed on TSV liner 20 and covering the sidewalls and the bottom of TSV liner 20. Diffusion barrier layer 32 may include titanium, titanium nitride, tantalum, tantalum nitride, or combinations thereof, and can be formed using physical vapor deposition, sputtering, and the like. It is observed that with thickness T$_{middle}$ (FIG. 4) of the sidewall portion of TSV liner 20 being no less than thickness T$_{top}$, it is easier to form diffusion barrier layer 32 with good conformity.

Next, the remaining portion of TSV opening 18 is filled with a metallic material, and hence TSV 34 is formed. The formation process of TSV 34 is known in the art, and hence is not discussed in detail herein. The material of TSV 34 may include copper, aluminum, and/or other conductive materials.

Figure 8:
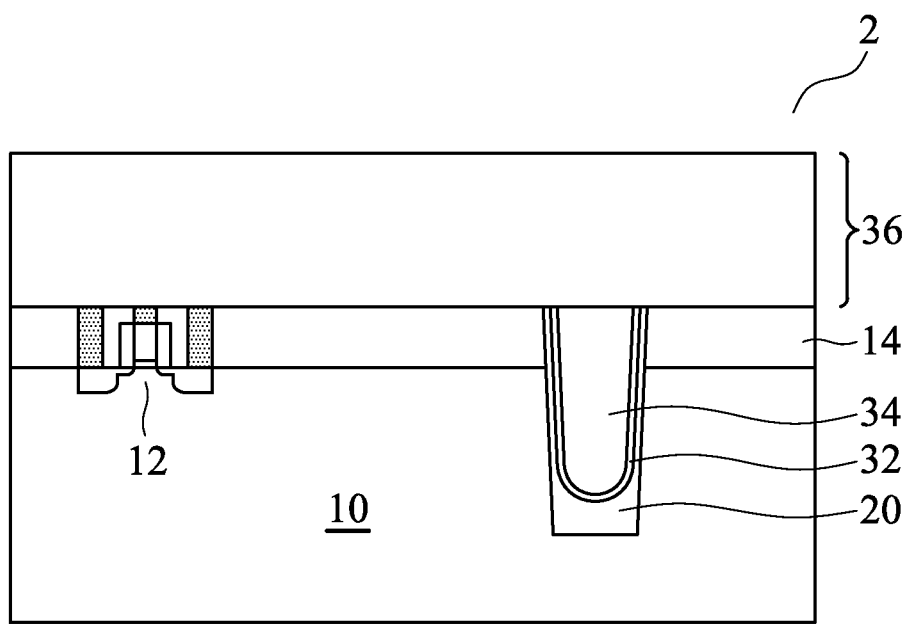

FIG. 8 illustrates the overlying structures on top of TSV 34, which includes interconnect structure 36. Interconnect structure 36 may include metal lines and vias (not shown) formed in dielectric layers, which may be low-k dielectric layers. The metal lines and vias may be electrically connected to TSV 34. Interconnect structure 36 may also include passivation layers, bond pads (not shown), and the like.

Figure 9:
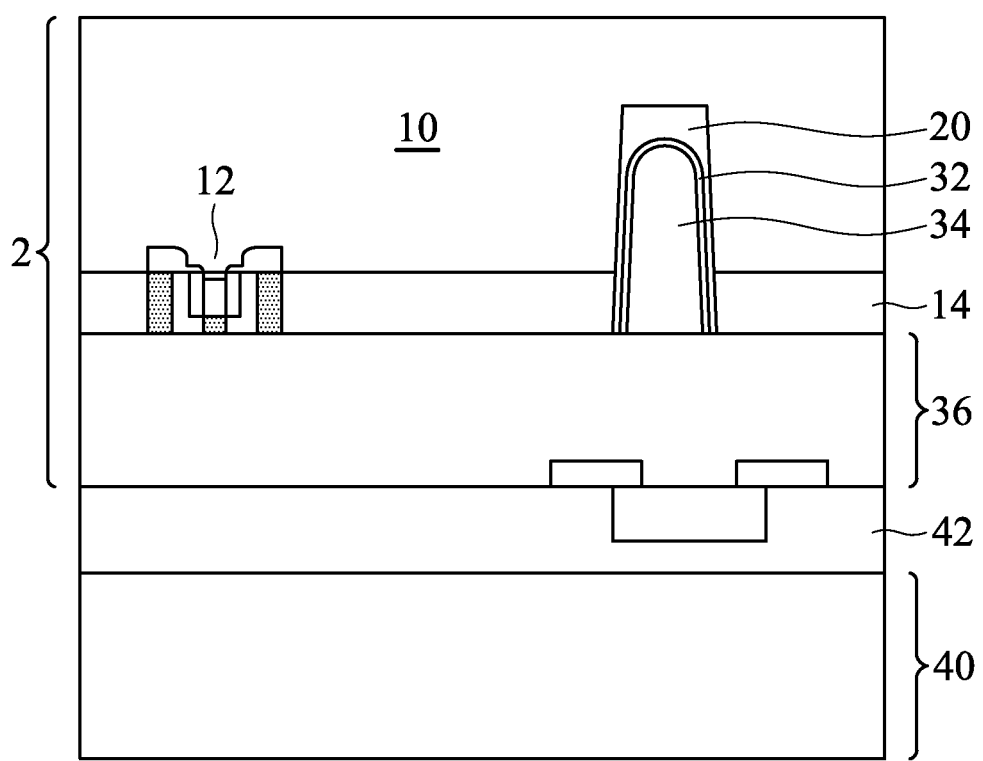
Figure 10:
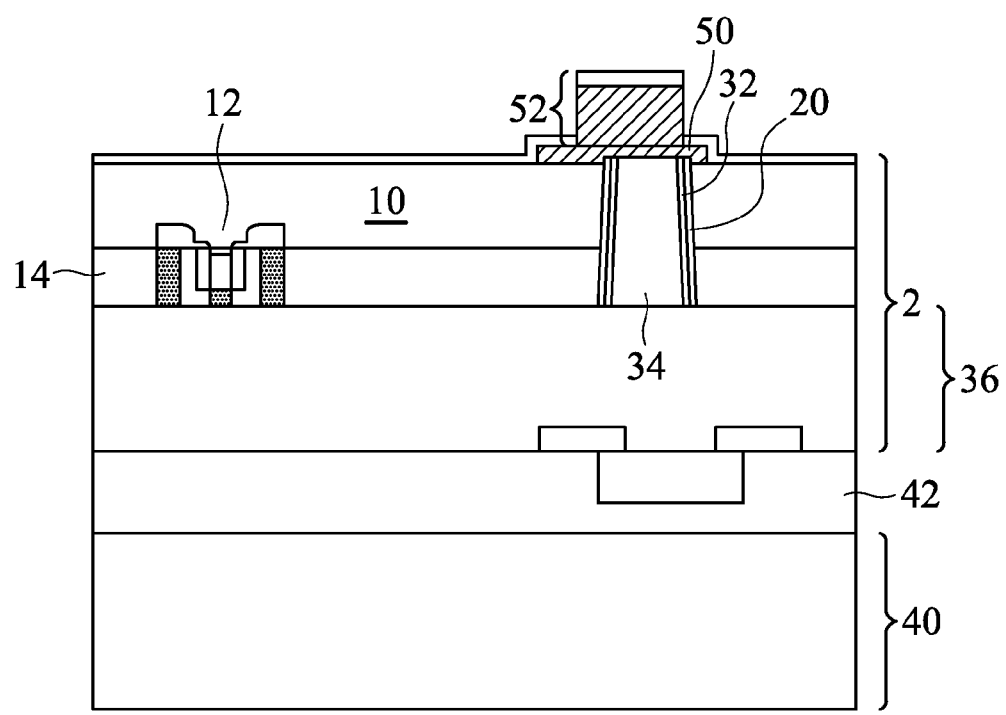

Referring to FIG. 9, the top surface of wafer 2 may be mounted on carrier wafer 40, for example, through adhesive 42. The back end of TSV 34 is then grinded, and the bottom portion of TSV liner 20 is removed. In subsequent process steps, the backside interconnect structures, which may include redistribution line (RDL) 50 and contact pad 52, may be formed on the backside of wafer 2, as shown in FIG. 10.

Figure 11:
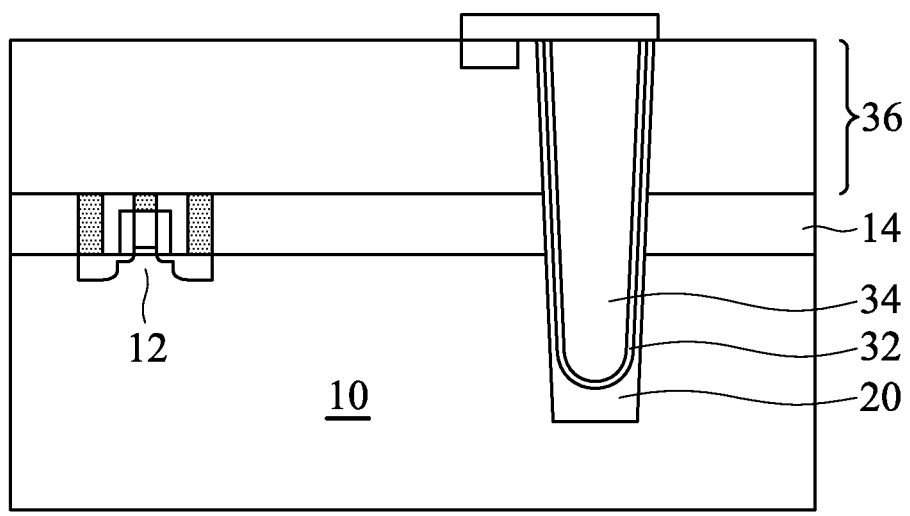
FIG. 11 illustrates a cross-sectional view of a portion of a wafer in accordance with an embodiment, wherein a TSV extends into inter-metal dielectrics.

In the embodiments discussed in preceding paragraphs, TSV 34 is formed using a via-first approach, and is formed before the formation of a bottom metallization layer (commonly known as M1). Accordingly, TSV 34 only extends into ILD 14, but not into the overlying IMDs in interconnect structure 36. In alternative embodiments, as shown in FIG. 11, TSV 34 is formed using a via-last approach, and is formed after the formation of interconnect structure 36. Accordingly, TSV 34 penetrates through ILD 14 and interconnect structure 36 and extends into substrate 10. Similarly, TSV liner 20 is formed on the sidewalls of the TSV opening in which TSV 34 is located, and electrically insulates TSV 34 from substrate 10. The subsequent process for forming the backside interconnect structure is essentially the same as shown in FIG. 10, and hence is not repeated herein.

It is appreciated that although TSV liner 20 is used as an example to explain the concept of the embodiments, the embodiment may apply to the formation of liners of other openings, such as trenches or via openings. One skilled in the art will be able to determine the processes by incorporating the teaching provided in preceding paragraphs. The embodiments are particularly suitable for forming liners in openings having very high aspect ratios.

The embodiments have several advantageous features. With the use of spin-on coating, the TSV liners may have better conformity than when formed using other methods. The bottom and sidewall coverage is also better than for those formed using CVD. The process time and cost are low. Further, the k values of the TSV liners are adjustable.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method comprising:
   forming an opening in a substrate; and
   forming a liner dielectric in the opening using spraying, wherein the liner dielectric comprises a sidewall portion on a sidewall of the opening and a bottom portion on a bottom of the opening, and wherein thicknesses of the sidewall portion increase substantially continuously from top to bottom.

2. The method of claim 1, wherein the forming the liner dielectric comprises:
   placing the substrate with the opening facing up;
   rotating the substrate with a first speed;
   spraying a chemical on the substrate;
   after the step of spraying the chemical, stopping rotating the substrate; and
   after the step of stopping rotating the substrate, rotating the substrate with a second speed greater than the first speed.

3. The method of claim 2, wherein the first speed is between about 200 revolutions per minute (RPM) and about 250 RPM.

4. The method of claim 2, wherein a duration of the step of stopping rotating is greater than about 10 seconds.

5. The method of claim 2, wherein, at a time the chemical is sprayed on the substrate, an evaporation rate of the chemical is greater than about 3 pound per square inch (psi).

6. The method of claim 2, wherein the chemical comprises tetra-ethyl-ortho-silicate (TEOS) and methyltriethoxysilane (MTES).

7. A method of forming an integrated circuit structure, the method comprising:
   providing a semiconductor substrate;
   forming a through-semiconductor via (TSV) opening in the substrate semiconductor;

forming a TSV liner in the opening using a method selected from the group consisting essentially of spraying, spin-on coating, and combinations thereof, wherein the TSV liner comprises:
- a sidewall portion on a sidewall of the opening; and
- a bottom portion at a bottom of the opening, and wherein a top end of the TSV liner is lower than a top of the TSV opening, wherein the bottom portion of the TSV liner has a thickness between about 5 percent and about 20 percent of a depth of the TSV opening; and filling a conductive material into the TSV opening to form a TSV.

8. The method of claim 7 further comprising grinding a portion of the semiconductor substrate, wherein the bottom portion of the TSV liner is removed.

9. The method of claim 7, wherein the step of forming the TSV liner comprises:
- placing the semiconductor substrate with the TSV opening facing up;
- rotating the semiconductor substrate with a first speed;
- during the step of rotating the semiconductor substrate with the first speed, spraying a chemical on the semiconductor substrate;
- after the step of spraying the chemical, reducing a rotating speed of the semiconductor substrate; and
- after the step of reducing the rotating speed of the semiconductor substrate and with the chemical on the semiconductor substrate, rotating the semiconductor substrate with a second speed greater than the first speed.

10. The method of claim 9 further comprising, after the step of rotating the semiconductor substrate with the second speed, baking the semiconductor substrate to solidify the chemical.

11. The method of claim 9, wherein the first speed is between about 200 revolutions per minute (RPM) and about 250 RPM.

12. The method of claim 9, wherein the second speed is between 500 RPM and about 3,000 RPM.

13. The method of claim 9, wherein during the step of reducing the rotating speed of the semiconductor substrate, the semiconductor substrate is fully stopped from rotating.

14. The method of claim 9, wherein a duration of the step of stopping rotating is greater than about 10 seconds.

15. The method of claim 9, wherein an evaporation rate of the chemical is greater than about 3 pound per square inch (psi).

16. A method comprising:
- forming an opening in a semiconductor substrate; and
- forming a liner dielectric in the opening, wherein the liner dielectric comprises a sidewall portion on a sidewall of the opening and a bottom portion on a bottom of the opening, and wherein the step of forming the liner comprises:
  - placing the semiconductor substrate with the opening facing up;
  - rotating the semiconductor substrate with a first speed;
  - spraying a chemical on the semiconductor substrate;
  - after the step of spraying the chemical, stopping rotating the semiconductor substrate; and
  - after the step of stopping rotating the semiconductor substrate, rotating the semiconductor substrate with a second speed greater than the first speed.

17. The method of claim 16, wherein the first speed is between about 200 revolutions per minute (RPM) and about 250 RPM.

18. The method of claim 16, wherein a duration of the step of stopping rotating is greater than about 10 seconds.

* * * * *